United States Patent
Lee et al.

(10) Patent No.: US 9,437,617 B2
(45) Date of Patent: Sep. 6, 2016

(54) DISPLAY APPARATUS

(71) Applicant: Samsung Display Co., Ltd., Yongin, Gyeonggi-do (KR)

(72) Inventors: Iljeong Lee, Yongin (KR); Sewan Son, Yongin (KR); Minwoo Woo, Yongin (KR); Jeongsoo Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/791,909

(22) Filed: Jul. 6, 2015

(65) Prior Publication Data
US 2016/0190173 A1 Jun. 30, 2016

(30) Foreign Application Priority Data

Dec. 29, 2014 (KR) ........................ 10-2014-0192553

(51) Int. Cl.
*H01L 27/12* (2006.01)
(52) U.S. Cl.
CPC ......... *H01L 27/1222* (2013.01); *H01L 27/124* (2013.01)

(58) Field of Classification Search
CPC ..................... H01L 27/1222; H01L 27/124
See application file for complete search history.

(56) References Cited

U.S. PATENT DOCUMENTS

| | | | |
|---|---|---|---|
| 2010/0073273 | A1 | 3/2010 | Nam et al. |
| 2013/0010247 | A1* | 1/2013 | Wei ..................... G02F 1/13624 349/139 |
| 2014/0077163 | A1 | 3/2014 | Hack et al. |
| 2014/0084293 | A1 | 3/2014 | Ahn et al. |
| 2015/0372016 | A1* | 12/2015 | Cheng ................... H01L 27/124 257/72 |

FOREIGN PATENT DOCUMENTS

| | | |
|---|---|---|
| JP | 2014-59560 | 4/2014 |
| KR | 10-2008-0048722 | 6/2008 |
| KR | 10-2009-0002474 | 1/2009 |
| KR | 10-2010-0034160 | 4/2010 |

* cited by examiner

*Primary Examiner* — Yasser A Abdelaziez
(74) *Attorney, Agent, or Firm* — Knobbe Martens Olson & Bear LLP

(57) ABSTRACT

A display apparatus includes a first pixel and a second pixel adjacent to each other, wherein a first channel region of a driving transistor of the first pixel has a reverse U-shaped pattern, and a second channel region of a driving transistor of the second pixel has a pattern opposite the pattern of the first channel region.

11 Claims, 5 Drawing Sheets

DISPLAY APPARATUS

RELATED APPLICATION

This application claims the benefit of Korean Patent Application No. 10-2014-0192553, filed on Dec. 29, 2014, in the Korean Intellectual Property Office, the disclosure of which is incorporated herein in its entirety by reference.

BACKGROUND

1. Field

One or more embodiments relate to a display apparatus.

2. Description of the Related Technology

A backplane of a display apparatus includes a plurality of fine patterns formed via a photolithography process. The photolithography process generally includes coating a photoresist layer on a patterned layer, and exposing a part of a surface of the patterned layer by performing a light exposure and development process using a photomask in order to form a photoresist layer pattern. Thereafter, an exposed part of the patterned layer is removed by etching using the photoresist layer pattern as a mask, and the photoresist layer pattern is stripped to form a target pattern.

In this regard, as a degree of integration of backplane circuits has been increased to manufacture display apparatuses having high resolution, a distance between thin film patterns has been decreased, and thus, a space margin may be insufficient. Thus, when a pattern having an insufficient space margin is formed using a photolithography process, a short error between the patterns that need to be separated may occur.

SUMMARY OF CERTAIN INVENTIVE ASPECTS

One or more embodiments include a display apparatus.

Additional aspects will be set forth in part in the description which follows and, in part, will be apparent from the description, or may be learned by practice of the presented embodiments.

According to one or more embodiments, a display apparatus includes a first pixel and a second pixel that are adjacent to each other, wherein a first channel region of a driving transistor of the first pixel includes a U-shaped pattern, and a second channel region of a driving transistor of the second pixel has a pattern that is the pattern of the first channel region inversed upside down and left side right.

These and other aspects, features, and advantages will be apparent from the drawings, the claims, and the following detailed description.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION OF CERTAIN INVENTIVE EMBODIMENTS

Figure 1:
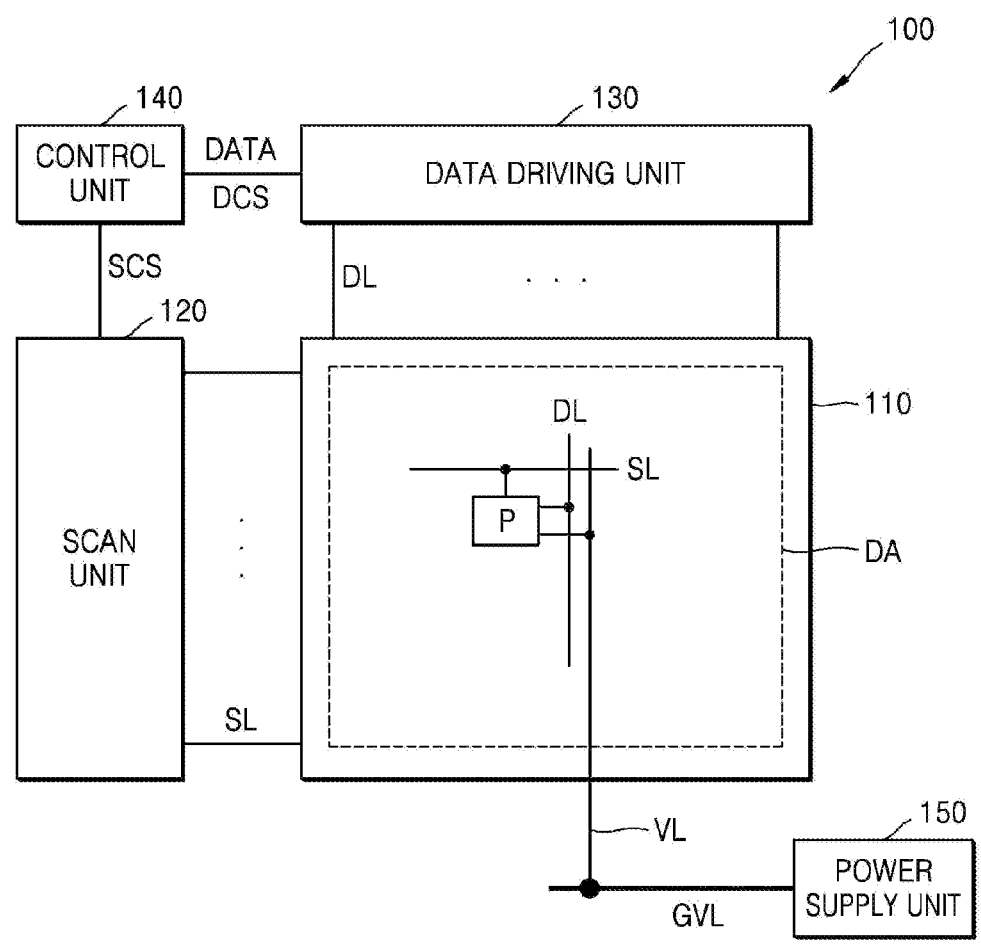
FIG. 1 schematically illustrates a display apparatus according to an embodiment.

Reference will now be made in detail to certain embodiments, examples of which are illustrated in the accompanying drawings, wherein like reference numerals generally refer to like elements throughout. In this regard, the presented embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the inventive concepts allow for various changes and numerous embodiments, particular embodiments will be illustrated in the drawings and described in detail in the written description. However, this is not intended to limit the inventive concepts to particular modes of practice, and it is to be appreciated that all changes, equivalents, and substitutes that do not depart from the spirit and technical scope are encompassed in the inventive concepts. In the description, certain detailed explanations of the related art are omitted when it is deemed that they may unnecessarily obscure the essence of the inventive concepts.

It will be understood that although the terms "first," "second," and the like may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

In one or more embodiments hereafter, a row direction or a column direction may be applied interchangeably.

FIG. 1 schematically illustrates a display apparatus 100 according to an embodiment.

Referring to FIG. 1, the display apparatus 100 may include a display panel 110, a scan driving unit 120, a data driving unit 130, and a control unit 140.

The display panel 110 according to an embodiment includes pixels P, scan lines (referred to as 'SL'), data lines (referred to as 'DL'), and power lines (referred to as 'VL').

The pixels P are arranged in a matrix shape along row directions and column directions. The data lines DL are each connected to the pixels P in the same column and thus transmit data signals to the pixels of the same column. The scan lines SL are each connected to the pixels P in the same row and thus transmit scan signals to the pixels P of the same row. The power lines VL are each included in a pixel column and transfer power voltages to the pixels P in the same column. In an embodiment shown in FIG. 1, the power lines VL are included in each of the pixel columns, but the power lines VL may be included in pixel rows, and in this case, each of the power lines VL may be connected to the pixels P in the same row and may transfer power voltages to the pixels P in the same row. The pixels are included in a display area DA. The power lines VL may receive a power voltage from global power lines GVL that are included in a peripheral region of the display area DA. The global power lines GVL receive a power voltage from a power supply unit 150 and may transfer the power voltage to the power lines VL. A type of the global power lines GVL is not particularly limited, and examples of the global power lines GVL may be film lines or wire lines, among others.

Each of the pixels P may include a pixel circuit. When the display apparatus 110 according to an embodiment is a self-light emitting display apparatus, for example, an organic light-emitting display apparatus, each of the pixels P may include the pixel circuit and a light-emitting diode connected to the pixel circuit. The pixels P will be described in detail with reference to FIG. 2.

Referring still to FIG. 1, the control unit 140 receives image data from the outside and controls the scan driving unit 120 and the data driving unit 130. The control unit 140 generates control signals SCS, DCS, and digital data DATA. The control unit 140 provides a first control signal SCS to the scan driving unit 120 and provides a second control signal DCS and digital data DATA to the data driving unit 130. Hereinafter, the first control signal SCS may be referred to as a scan control signal, and the second control signal DCS may be referred to as a data control signal.

The scan driving unit 120 drives the scan lines SL according to a predetermined order in response to the first control signal SCS. For example, the scan driving unit 120 generates a scan signal S and may provide the scan signal to the pixels P through the scan lines SL.

The data driving unit 130 drives the data lines DL in response to the second control signal DCS and digital data DATA. The data driving unit 130 generates data signals that are each respectively corresponded to the data lines DL and thus may provide the data signals to the pixels P through the data lines DL.

Figure 2:
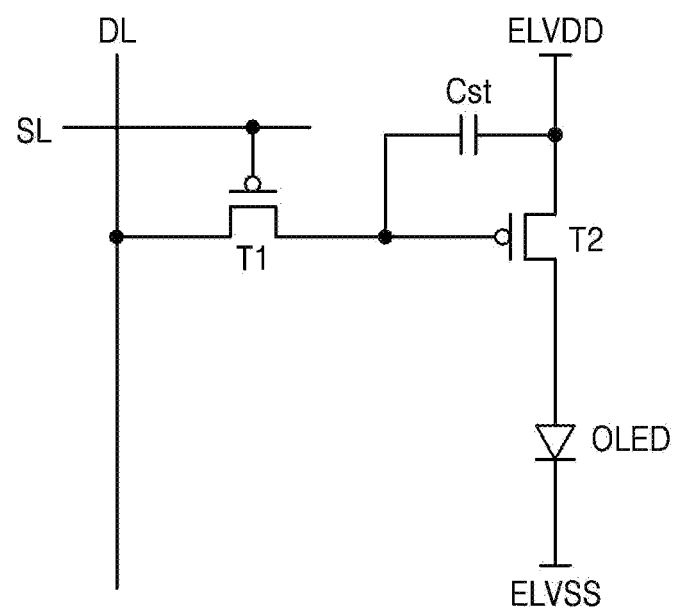
FIG. 2 illustrates a pixel circuit diagram according to an embodiment.

FIG. 2 illustrates a pixel circuit diagram according to an embodiment.

In FIG. 2, a circuit diagram of the pixel shown in FIG. 1 is schematically illustrated. Referring to FIG. 2, the pixel includes a first transistor T1, a second transistor T2, a capacitor Cst, and a light-emitting diode OLED. The light-emitting diode OLED may include an interlayer disposed between a first electrode and a second electrode. However, embodiments are not limited thereto, and when a separate backlight is equipped in the display apparatus 110 according to an embodiment, the light-emitting diode OLED may be omitted or substituted with another element.

Referring to FIG. 2, a pixel is connected to a scan line SL of the same row and a data line DL of the same column. In particular, in terms of the first transistor T1, a gate electrode is connected to a first line SL, a first electrode is connected to a second line DL, and a second electrode is connected to the second transistor T2. The second transistor T2 is connected between a first power source ELVDD and the light-emitting diode OLED to provide a driving current to the light-emitting diode OLED. In terms of the second transistor T2, a gate electrode of is connected to the first transistor T1, a voltage from the first power source ELVDD is applied to a first electrode, and a second electrode is connected to a pixel electrode of the light-emitting diode OLED. In terms of the capacitor Cst, a first electrode is connected between the first transistor T1 and the second transistor T2, and a voltage from the first power source ELVDD is applied to a second electrode.

FIG. 2 illustrates a 2Tr-1Cap structure including two transistors and one capacitor in one pixel, but embodiments are not limited thereto. Thus, a plurality of thin film transistors and at least one capacitor may be included in one pixel, and the pixel may have various structures by further adding separate lines or omitting conventional lines. In FIG. 2, the second transistor T2 is directly connected to the light-emitting diode OLED, but a separate circuit diode may be further included between the second transistor T2 and the light-emitting diode OLED.

For example, the pixels P according to an embodiment may have a 7Tr-1Cap structure including seven transistors and one capacitor.

Figure 3:
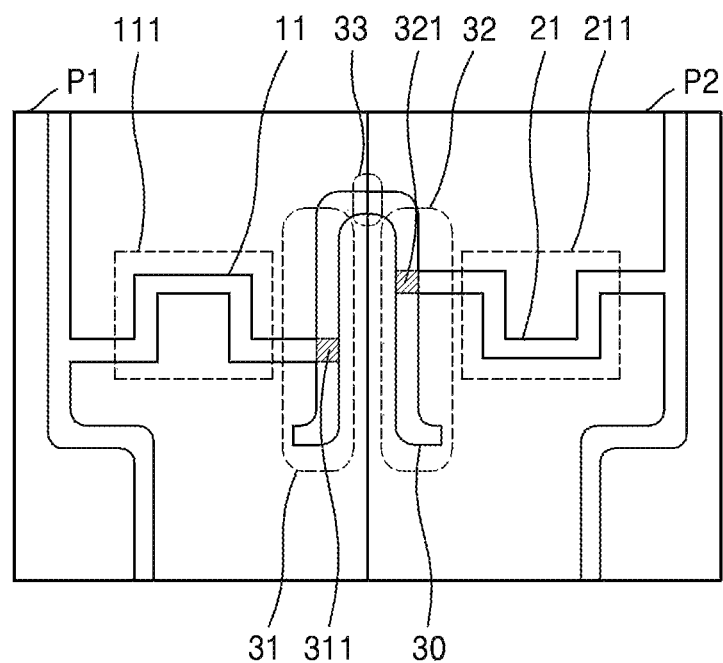
FIG. 3 illustrates an example of a structure of a first pixel and a second pixel adjacent to each other.

FIG. 3 illustrates an example of a structure including a first pixel P1 and a second pixel P2 adjacent to each other.

FIG. 3 illustrates a part of a plan view of the first pixel P1 and the second pixel P2 adjacent to the first pixel P1. First, referring to FIG. 3, a first channel area 11 is in a driving transistor of the first pixel P1. A driving transistor of the second pixel P2 includes a second channel area 21.

Here, the driving transistor denotes a transistor that supplies a driving current to a light-emitting diode OLED of a pixel. When a display apparatus is not an organic light-emitting display apparatus, for example, when a display apparatus is a liquid display apparatus, a driving transistor denotes a transistor that applies a driving voltage to a liquid layer. A channel area of the driving transistor overlaps with a gate electrode (not shown) and is an area where current flows according to a voltage of the gate electrode.

Referring to FIG. 3, the first channel area 11 has a reverse U-shaped pattern 111 and the second channel area 21 has a U-shaped pattern 211, which can be opposite the reverse U-shaped pattern of the first channel area. The reverse U-shaped pattern 111 and the U-shaped pattern 211 can be squared-off as shown in FIG. 3. The first channel area 11 and the second channel area 21 may have a plurality of various patterns, such as U-shaped patterns or zigzag patterns, to satisfy semiconductor characteristics required for a driving transistor. In some embodiments, a pattern of the first channel area 11 may be bisymmetrical, and a pattern of the second channel area 21 may be bisymmetrical as well.

As shown in FIG. 3, the second channel area 21 and the first channel area 11 can have opposite patterns.

First, each of the first channel area 11 and the second channel area 21 receives a power voltage to provide a driving current, and the display apparatus according to an embodiment may apply a power voltage to two pixels P1 and P2 adjacent to each other by using one power electrode.

In FIG. 3, a first electrode 31 applying power to the first pixel P1 and a second electrode 32 applying power to the second pixel P2 face each other between the first pixel P1 and the second pixel P2. The first electrode 31 and the second electrode 32 may be parallel to each other. Ends of the first electrode 31 and the second electrode 32 are connected to each other and thus may be formed as a power electrode 30 which receives the same power voltage.

The first channel area 11 is connected to a first node 311 on the first electrode 31, and the second channel area 21 is connected to a second node 321 on the second electrode 32. The first node 311 and the second node 321 do not face each other.

The power electrode 30 may have a reverse U-shape. A power line (not shown) may be connected to a center part 33 of the power electrode 30 having a U-shape pattern, and the power electrode 30 receives a power voltage from a power line and applies the power voltage to the first channel area 11 and the second channel area 21. The pattern of the power electrode 30 may be bisymmetrical. Regarding the structure of the power electrode 30 described above, a power voltage may be applied to two pixel columns by using one power line, and thus a space occupied by the power line may be reduced compared to the case when every pixel column has a power line, and thus a high opening ratio may be secured.

As shown in FIG. 3, when a power voltage of the first pixel P1 and the second pixel P2 is supplied through the power line included between the first pixel P1 and the second pixel P2, the first pixel P1 receives a power voltage from a right side of a pixel, and the second pixel P2 receives a power voltage from a left side of a pixel. Thus, the pattern of the first channel area 11 and the pattern of the second channel area 21 may be bisymmetrical.

However, when the pattern of the first channel area 11 and the pattern of the second channel area 21 are bisymmetrical, but not inverted upside down, a density of the pattern may be dense in a particular area. For example, when the pattern of the first channel area 11 and the pattern of the second channel area 21 are only bisymmetrical, the first node 311, at which the first channel area 11 is connected to the first electrode 31, and the second node 321, at which the second channel area 22 is connected to the second electrode 32, may face each other, and the patterns may be densely formed near the first node 311 and the second node 321. In this regard, when the pattern is densely formed at a particular area, some area may lack etching during a process of forming the pattern, and etching may be overly performed on the other part, and thus defects may be caused on a circuit. For example, a short circuit may occur or the circuit may be disconnected.

According to an embodiment, the pattern of the first channel area 11 and the pattern of the second channel area 21 may be symmetrical in a vertical direction as well as symmetrical in a horizontal direction. Referring to FIG. 3, the first channel area 11 includes a vertically inverted U-shaped pattern 111, and the second channel area 21 includes a U-shaped pattern 211 that is not inverted.

In this regard, when the two pixels P1 and P2 that are adjacent to each other have patterns that are inverted left side right and upside down from each other, the first node 311 and the second node 321 are positioned to avoid facing each other, and thus densely focusing a thin film pattern of a pixel on a particular area may be prevented, and a defect ratio in a patterning process may be reduced. Also, since channel area patterns of the two pixels P1 and P2 have the same length and width of a channel except the patterns being inverted left side right and upside down, the same channel length and width with respect to the channel areas of the two pixels P1 and P2 may be secured, and a driving transistor having the same characteristics with respect to the two pixels P1 and P2 may be prepared.

Figure 4:
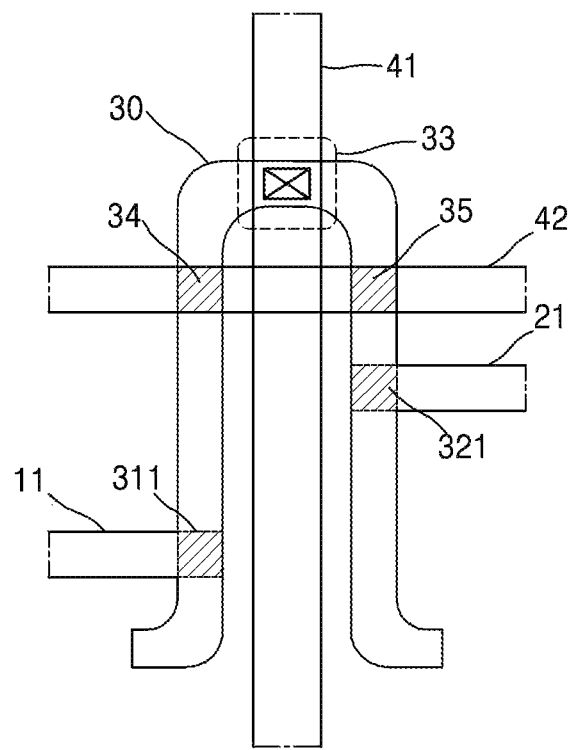
FIG. 4 illustrates a power electrode shown in FIG. 3.

FIG. 4 illustrates the power electrode 30 shown in FIG. 3 in detail.

Referring to FIG. 4, the power electrode 30 shown in FIG. 3 is illustrated in detail. Referring to FIG. 4, the power electrode 30 is connected to the power line 41 at the center part 33 and thus receives a power voltage from the power line 41. The power electrode 30 and the power line 41 may be connected through a contact hole, but embodiments are not limited thereto.

The power electrode 30 is connected to the channel area 11 of the first pixel at the first node 311 to apply a power voltage of the first pixel, and is connected to the channel area 21 of the second pixel at the second node 321 to apply a power voltage to the second pixel.

The power electrode 30 may include a first transistor 34, which is positioned between the center part 33 and the first node 311, and a second transistor 35, which is positioned between the center part 33 and the second node 321. In this regard, the gate electrode 42 crosses the power electrode 30 and thus may cover some parts of the power electrode 30. The first transistor 34 may control a power voltage applied to the first node 311, and the second transistor 35 may control a power voltage applied to the second node 321.

The power electrode 30, the first channel area 11, and the second channel area 21 may be formed in the same layer. The power electrode 30 and the power line 41 may be in different layers, and the power electrode 30 and the gate electrode 42 may be in different layers.

Figure 5:
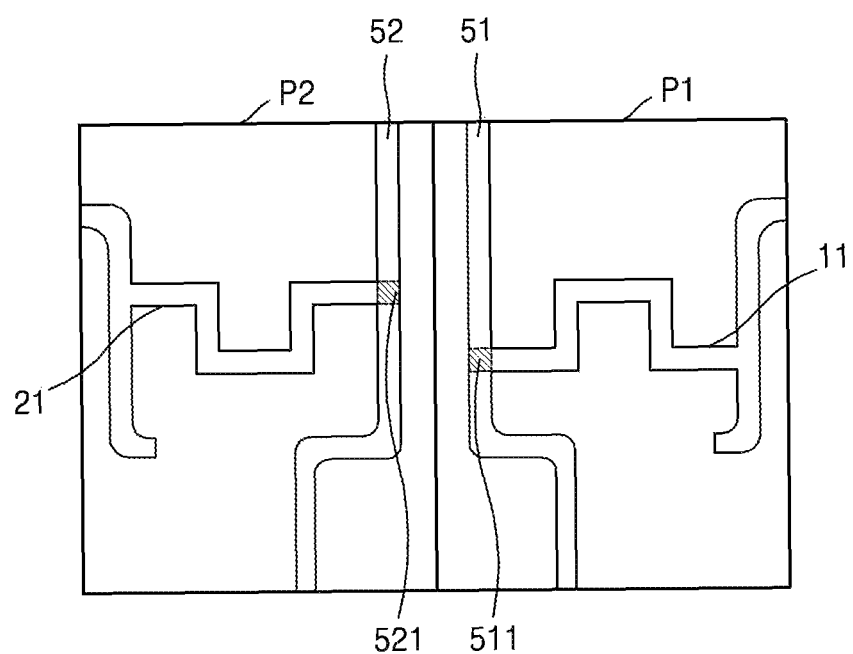
FIG. 5 illustrates another example of a structure of a first pixel and a second pixel adjacent to each other.

FIG. 5 illustrates another example of a structure of a first pixel P1 and a second pixel P2 adjacent to each other.

In FIG. 5, the second pixel P2 may be the same pixel with the second pixel P2 shown in FIG. 3. Referring to FIG. 5, a first electrode 51 and a second electrode 52 are positioned to face each other between the first pixel P1 and the second pixel P2 adjacent to each other. A first channel area 11 is connected to a first node 511 on the first electrode 51, and a second channel area 21 is connected to a second node 521 on the second electrode 52.

When the display apparatus according to an embodiment is an organic light-emitting display apparatus, a driving current flowing through a driving transistor of the first pixel P1 may be supplied to a light-emitting diode through the first electrode 51, and a driving current flowing through a driving transistor of the second pixel P2 may be supplied to a light-emitting diode through the second electrode 52.

Referring to FIG. 5, a pattern of the first channel area 11 and a pattern of the second channel area 21 are inverted left side right and upside down, and thus the first node 511 and the second node 521 are positioned to avoid facing each other.

As described above, according to the one or more of the above embodiments, a yield of a display apparatus increases as space margin of a backplane thin film pattern is secured.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
   a first pixel;
   a second pixel, wherein the first pixel and the second pixel are adjacent to each other;
   a power electrode between the first pixel and the second pixel, wherein the power electrode comprises a first electrode and a second electrode;

a first channel region of a driving transistor of the first pixel comprises a curved pattern; and a second channel region of a driving transistor of the second pixel has a pattern opposite the pattern of the first channel region, wherein a first node connecting the first electrode and the first channel region, and a second node connecting the second electrode and the second channel region do not face each other.

2. The display apparatus of claim 1, wherein an end of the first electrode and an end of the second electrode are connected to each other.

3. The display apparatus of claim 1, wherein the first electrode and the second electrode face each other.

4. The display apparatus of claim 1, wherein the power electrode has a U-shaped pattern.

5. The display apparatus of claim 4, wherein a power voltage is supplied to the power electrode from a power line connected to a center portion of the U-shaped pattern.

6. The display apparatus of claim 4, wherein the power electrode comprises:

a first transistor between the first node and the center portion; and a second transistor between the second node and the center portion.

7. The display apparatus of claim 6, wherein the first transistor controls supply of the power voltage to the first node, and the second transistor controls supply of the power voltage to the second node.

8. The display apparatus of claim 1, wherein a pattern of the power electrode is bisymmetrical.

9. The display apparatus of claim 1, wherein
the first electrode and the second electrode face each other between the first pixel and the second pixel.

10. The display apparatus of claim 1, wherein the pattern of the first channel region of the first pixel is bisymmetrical, and the pattern of the second channel region of the second pixel is bisymmetrical.

11. The display apparatus of claim 1, wherein the curved pattern of the first channel region of the first pixel is a reverse U-shaped pattern.

* * * * *